(12) United States Patent
Suzuki

(10) Patent No.: US 9,837,601 B2
(45) Date of Patent: Dec. 5, 2017

(54) MAGNETIC SHIELD, SEMICONDUCTOR DEVICE, AND SEMICONDUCTOR PACKAGE

(71) Applicant: Renesas Electronics Corporation, Kawasaki-shi, Kanagawa (JP)

(72) Inventor: Tetsuhiro Suzuki, Kanagawa (JP)

(73) Assignee: Renesas Electronics Corporation, Koutou-ku, Tokyo (JP)

( * ) Notice: Subject to any disclaimer, the term of this patent is extended or adjusted under 35 U.S.C. 154(b) by 0 days.

(21) Appl. No.: 14/296,697

(22) Filed: Jun. 5, 2014

(65) Prior Publication Data

US 2014/0374860 A1    Dec. 25, 2014

(30) Foreign Application Priority Data

Jun. 25, 2013    (JP) ................. 2013-132750

(51) Int. Cl.
*H01L 43/02* (2006.01)
*H01L 23/552* (2006.01)
(Continued)

(52) U.S. Cl.
CPC ............ *H01L 43/02* (2013.01); *H01L 23/552* (2013.01); *H01L 27/228* (2013.01); *H01L 24/73* (2013.01);
(Continued)

(58) Field of Classification Search
CPC ....... H01L 27/11507; H01L 2224/2916; H01L 2924/1435; H01L 2924/1436; H01L 2924/1441; H01L 2924/1443; H01L 23/552; H01L 43/02; H01L 43/12; H01L 43/08; H01L 43/10; H01L 27/222–27/228; H01L 29/685; H01L 23/49506; H01L 2924/1434; H01L 45/04; H01L 43/00–43/14; H01L 21/76807; H01L 21/76877; H01L 21/76819; H01L 21/8229; H01L 21/8239; H01L 2224/32245; H01L 2224/48091; H01L 2224/48247; H01L 2224/73265; H01L 2924/00012; H01L 2924/00014; H01L 2924/181; B05D 5/12; G11C 11/15; G11C 19/08; G11C 14/0036; G11C 14/0081; H01F 41/303; H01F 41/304; H01F 41/306; H01F 41/307
USPC ........ 257/422, 295, 421, E21.001, E21, 665, 257/E43.001, E43.006; 428/811, 3, 457, 428/337, 621, 216, 411.1
See application file for complete search history.

(56) References Cited

U.S. PATENT DOCUMENTS 5,838,521 A * 11/1998 Ravipati .............. G11B 5/3903
                                                  360/319
6,992,359 B2    1/2006 Nguyen et al.
(Continued)

FOREIGN PATENT DOCUMENTS

JP    2003-115578 A    4/2003
JP    2007-525847 A    9/2007

*Primary Examiner* — Natalia Gondarenko
(74) *Attorney, Agent, or Firm* — Sughrue Mion, PLLC

(57) ABSTRACT

Provided is a magnetic shield having improved shielding properties from an external magnetic field. A magnetic shield MS1 has in-plane magnetization as remanent magnetization, and is adapted to generate a perpendicular component in the magnetization direction by applying a magnetic field in the perpendicular direction to the magnetic shield.

7 Claims, 6 Drawing Sheets

(51) Int. Cl.
*H01L 27/22* (2006.01)
*H01L 29/82* (2006.01)
*H01L 23/00* (2006.01)

(52) U.S. Cl.
CPC ............ *H01L 2224/32245* (2013.01); *H01L 2224/48091* (2013.01); *H01L 2224/48247* (2013.01); *H01L 2224/73265* (2013.01); *H01L 2924/181* (2013.01); *Y10T 428/1107* (2015.01)

(56) References Cited

U.S. PATENT DOCUMENTS

| | | | |
|---|---|---|---|
| 8,994,131 B2* | 3/2015 | Shimomura et al. | 257/421 |
| 2005/0104101 A1 | 5/2005 | Sun et al. | |
| 2005/0116255 A1* | 6/2005 | Kato | B82Y 10/00 |
| | | | 257/200 |
| 2007/0281079 A1* | 12/2007 | Carey et al. | 427/131 |
| 2010/0309712 A1* | 12/2010 | Fukami | G11C 11/16 |
| | | | 365/158 |
| 2011/0241140 A1* | 10/2011 | Tsujiuchi et al. | 257/421 |
| 2014/0306302 A1* | 10/2014 | Jan | H01L 43/10 |
| | | | 257/421 |
| 2014/0319633 A1* | 10/2014 | Higo | H01L 29/82 |
| | | | 257/421 |

* cited by examiner

MS1

MS1

MAGNETIC SHIELD, SEMICONDUCTOR DEVICE, AND SEMICONDUCTOR PACKAGE

CROSS-REFERENCE TO RELATED APPLICATIONS

The disclosure of Japanese Patent Application No. 2013-132750 filed on Jun. 25, 2013 including the specification, drawings and abstract is incorporated herein by reference in its entirety.

BACKGROUND

The present invention relates to magnetic shields, semiconductor devices, and semiconductor packages, and more particularly, to a semiconductor device including a magnetoresistive memory, and a semiconductor package therein.

Currently, a magnetoresistive memory (MRAM (magnetoresistive random access memory) has been increasingly developed. Techniques regarding the magnetoresistive memory include, for example, those disclosed in Patent Documents 1 to 3.

Patent Documents 1 and 2 relate to the technique about the magnetoresistive memory in which the direction of magnetization of a free layer is reversed using spin implantation. As disclosed in any one of the above patent documents, the perpendicular anisotropy is applied to the free layer. Patent Document 3 discloses a nonvolatile solid-state magnetic memory device having a magnetic shield structure for shielding a MRAM chip from an external scattered magnetic field.

RELATED ART DOCUMENTS

Patent Documents

[Patent Document 1] Japanese Unexamined Patent Application Publication (Translation of PCT Application) No. 2007-525847
[Patent Document 2] U.S. Patent Application No. 2005/0104101
[Patent Document 3] Japanese Unexamined Patent Publication No. 2003-115578

SUMMARY

Some magnetoresistive memories are covered by a magnetic shield so as to suppress the influence of external magnetic field on the magnetoresistive memory. In such a magnetic shield, however, the change in magnetization in its perpendicular direction is interrupted by the influence of diamagnetic field acting in the thickness direction of the magnetic shield, which could make it difficult to achieve a sufficient magnetic permeability with respect to the external magnetic field in the perpendicular direction. In this case, the magnetic shield hardly achieves the sufficient shielding properties from the perpendicular external magnetic field.

Other problems and new features of the present invention will be clarified in the following detailed description in connection with the accompanying drawings.

According to one embodiment of the invention, a magnetic shield has the in-plane magnetization as remanent magnetization, and the perpendicular magnetic anisotropy is imparted to the magnetic shield.

In the one embodiment of the invention, the magnetic shield can improve its shielding properties from the external magnetic field.

DETAILED DESCRIPTION

Figure 1:
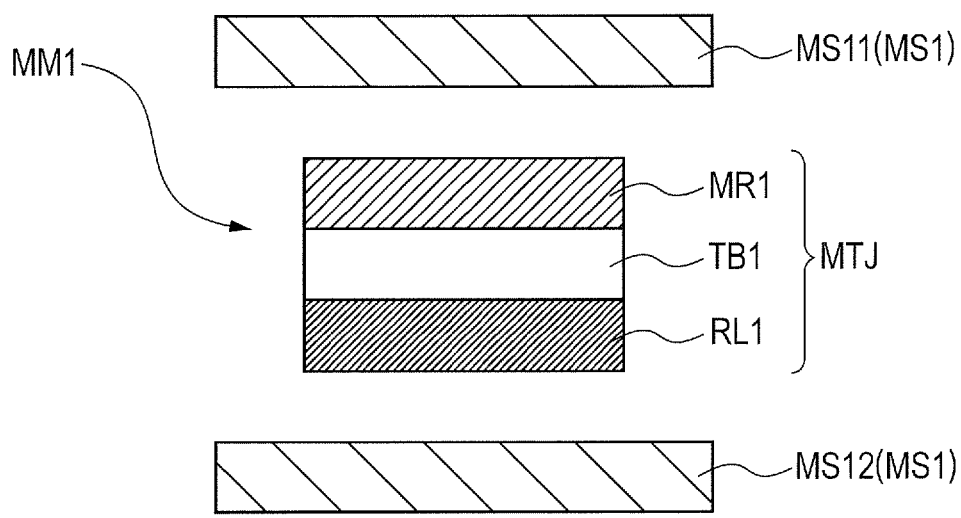
FIG. 1 is an exemplary cross-sectional view showing a magnetoresistive memory and a magnetic shield in one embodiment of the invention.

In the following, preferred embodiments of the present invention will be described with reference to the accompanying drawings. Wherever possible, the same reference numerals will be used through the drawings to refer to the same or like parts, and thus a description thereof will be omitted below.

FIG. 1 is an exemplary cross-sectional view of a magnetoresistive memory MM1 and a magnetic shield MS1 in one embodiment of the invention. FIG. 1 exemplarily shows the positional relationship between the magnetoresistive memory MM1 and the magnetic shield MS1.

The magnetic shield MS1 of this embodiment has the in-plane magnetization as remanent magnetization. By applying a magnetic field in the perpendicular direction, the magnetic shield MS1 generates a perpendicular component in the magnetization direction. As to the magnetization direction of the magnetic shield MS1 and the external magnetic field applied to the magnetic shield MS1, the term "perpendicular direction" as used herein means the direction perpendicular to (perpendicularly shown in FIG. 1) the film surface of the magnetic shield MS1, and the term "in-plane direction" as used herein means the direction parallel to the film surface of the magnetic shield MS1. The same goes for a magnetic recording layer MR1 and a magnetic reference layer RL1 to be described later.

In this embodiment, the perpendicular magnetic anisotropy is imparted to the magnetic shield MS1 having the in-plane magnetization as the remanent magnetization. In this case, the diamagnetic field acting on the magnetic shield MS1 in the thickness direction cancels the perpendicular magnetic anisotropy imparted to the magnetic shield MS1. Thus, by applying the external magnetic field to the magnetic shield MS1 in the perpendicular direction, the magnetic shield MS1 generates a perpendicular component in the magnetization direction. That is, the magnetic shield MS1 tends to cause a change in magnetization due to the external magnetic field in the perpendicular direction, and thus can achieve the sufficient magnetic permeability of the external magnetic field in the perpendicular direction. Thus, the magnetic shield can improve its shielding properties from the external magnetic field in the perpendicular direction.

The following will refer to the details of the structure of the magnetic shield MS1, a semiconductor device SD1 including the magnetic shield MS1, and the structure of a semiconductor package SP1 in this embodiment.

First, the structure of the magnetic shield MS1 will be described below.

The magnetic shield MS1 is disposed in the vicinity of the magnetoresistive memory MM1, and has a function of suppressing the influence of the external magnetic field on the magnetoresistive memory MM1. The magnetic shield MS1 is disposed spaced apart from the magnetoresistive memory MM1.

The magnetic shield MS1 of this embodiment can be formed in a flat plate-like shape having a thickness, for example, of not less 1 μm nor more than 10 μm, or in a thin film-like shape having a thickness of not less than 1 nm nor more than 30 nm. The flat plate-like magnetic shield MS1 is provided above or under the semiconductor chip including, for example, the magnetoresistive memory MM1. The magnetic shield MS1 in the form of thin film is provided, for example, above or under the magnetoresistive memory MM1 within the semiconductor chip.

In the example shown in the exemplary cross-sectional view of FIG. 1, the magnetic shields MS1 are respectively provided above and under the magnetoresistive memory MM1. Alternatively, the magnetic shield MS1 may be provided above or under the magnetoresistive memory MM1.

The magnetic shield MS1 is preferably provided to be superimposed over the entire magnetoresistive memory MM1 in the planar view. This structure can more effectively suppress the influences of the external magnetic field on the magnetoresistive memory MM1. In this embodiment, for example, the magnetic shield MS1 is provided to cover the entire magnetoresistive memories MM1 arranged in an array.

The magnetic shield MS1 has the in-plane magnetization as the remanent magnetization. By applying a magnetic field in the perpendicular direction, the magnetic shield MS1 generates a perpendicular component in the magnetization direction of the magnetic shield MS1. As to the magnetization direction of the magnetic shield MS1 and the external magnetic field applied to the magnetic shield MS1, the term "perpendicular direction" as used herein means the direction perpendicular to the film surface of the magnetic shield MS1. That is, the perpendicular direction is identical to the film thickness direction of the flat plate-like or thin film-like magnetic shield MS1. The in-plane direction is identical to the plane direction with the perpendicular direction set as the direction of a normal line.

Figure 2:
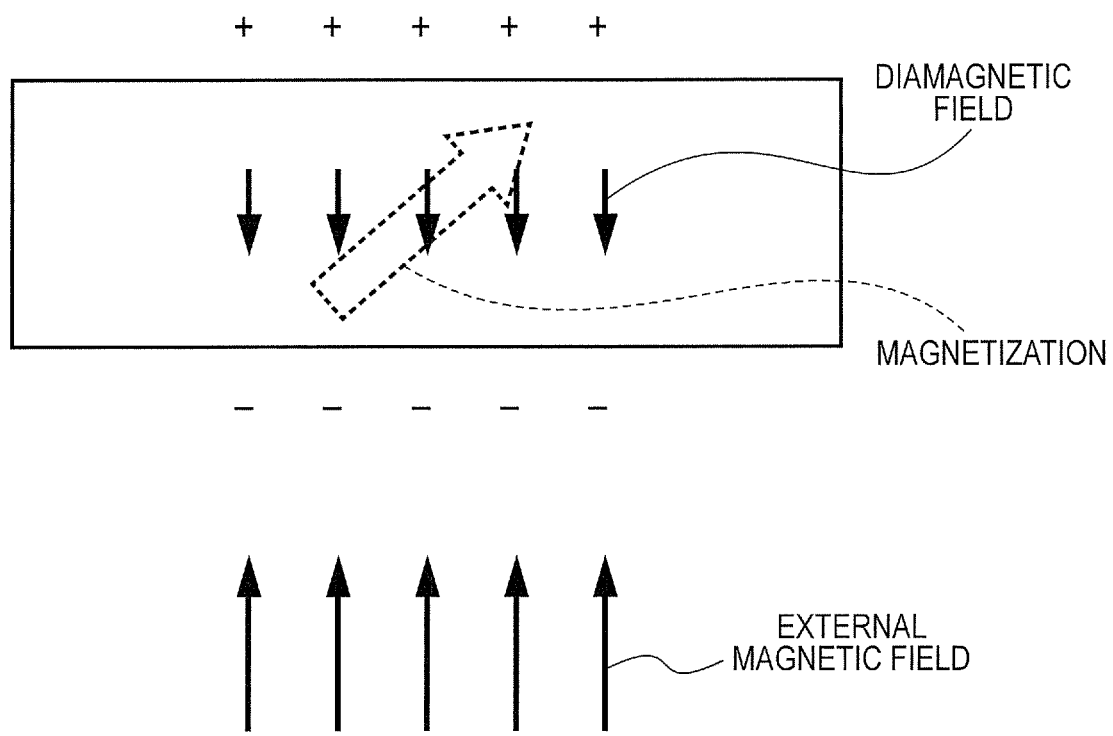
FIG. 2 is an exemplary cross-sectional view for explaining the change in magnetization within the magnetic shield.

FIG. 2 is an exemplary cross-sectional view for explaining the change in magnetization within the magnetic shield MS1.

When the external magnetic field is applied in the perpendicular direction to the flat plate-like or thin-film-like magnetic shield, polarization will occur at each of the upper and lower surfaces of the magnetic shield. The change in magnetization of the magnetic shield in the perpendicular direction is interrupted by the diamagnetic field generated in the magnetic shield by the polarization. In this case, it becomes difficult to obtain the sufficient magnetic permeability for the perpendicular external magnetic field.

The perpendicular magnetic anisotropy is imparted to the magnetic shield MS1 of this embodiment, so that the perpendicular magnetic anisotropy cancels the diamagnetic field. Thus, as shown in FIG. 2, the magnetization direction of the magnetic shield MS1 can easily change into the perpendicular direction. That is, the magnetic shield MS1 can achieve the high magnetic permeability for the external magnetic field in the perpendicular direction. Thus, a magnetic flux generated by the perpendicular external magnetic field can be effectively absorbed in the magnetic shield MS1. The magnetic shield MS1 has the in-plane magnetization as the remanent magnetization, so that the magnetic flux caused by the absorbed external magnetic field flows obliquely with respect to the perpendicular direction of the magnetic shield MS1. As a result, the density of magnetic flux around the magnetoresistive memory MM1 can be reduced. In this embodiment, for example, in the way described above, the magnetic shield MS1 can suppress the influence of the perpendicular external magnetic field on the magnetoresistive memory MM1.

Further, the magnetic shield MS1 of this embodiment can also achieve the high magnetic permeability for the external magnetic field in the in-plane direction because of the presence of the in-plane magnetization. Therefore, this embodiment can suppress the influence of the in-plane external magnetic field on the magnetoresistive memory MM1, using the magnetic shield MS1.

Figure 3:
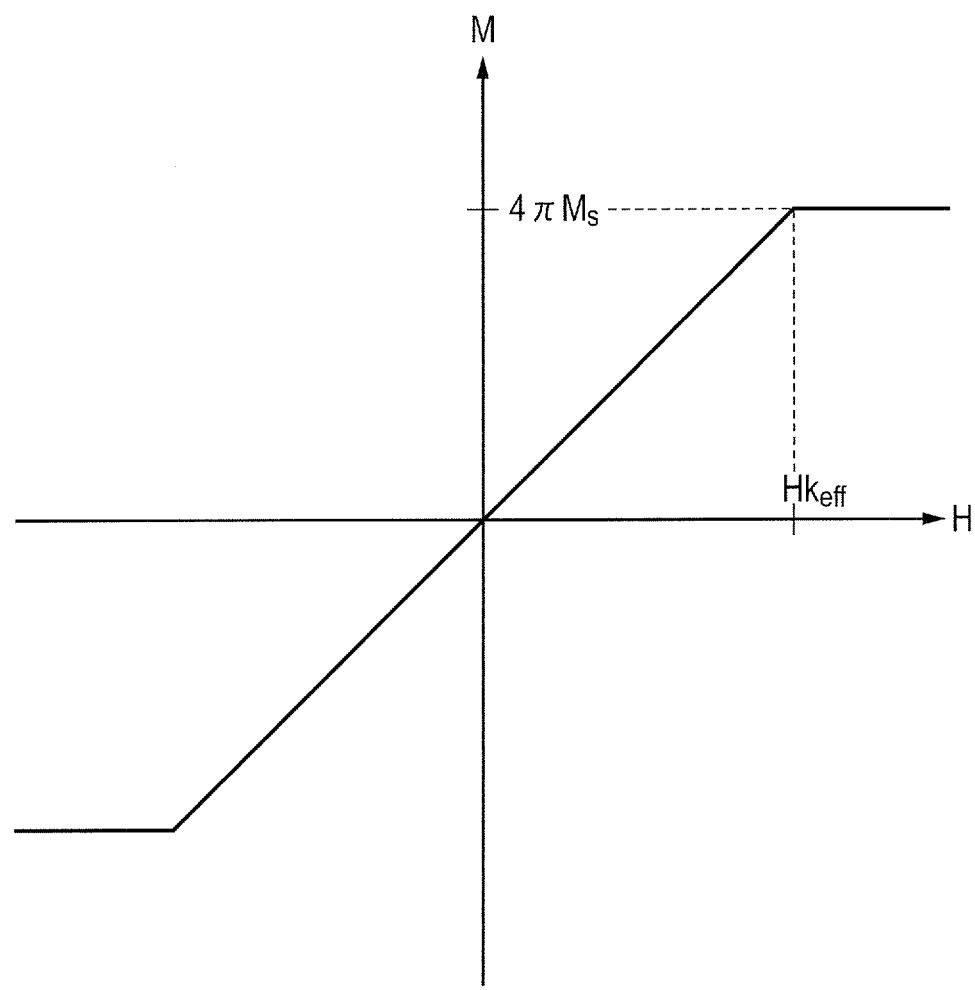
FIG. 3 is a graph exemplarily showing the relationship between the perpendicular external magnetic field, and a perpendicular magnetization component generated in the magnetic shield by the external magnetic field.

FIG. 3 is a graph exemplarily showing the relationship between the perpendicular external magnetic field applied to the magnetic shield MS1, and a perpendicular magnetization component generated in the magnetic shield by the external magnetic field. This figure shows a magnetization curve in which a horizontal axis indicates an external magnetic field H in the perpendicular direction, and a longitudinal axis indicates the perpendicular magnetization M generated in the magnetic shield MS1.

Like the magnetization curve shown in FIG. 3, by applying the perpendicular external magnetic field H to the magnetic shield MS1, the perpendicular magnetization M is generated within the magnetic shield MS1. The inclination of the magnetization curve can be adjusted to control the magnetic permeability of the magnetic shield MS1 with respect to the perpendicular external magnetic field. The inclination of the magnetization curve can be controlled by appropriately adjusting the material, structure, and formation conditions for forming the magnetic shield MS1.

In this embodiment, for example, $4\pi M_s$ is a saturated magnetization generated when a perpendicular external magnetic field $Hk_{eff}$ is applied to the magnetic shield MS1. In this case, the following formula is preferably satisfied: $5 \le 4\pi M_s / Hk_{eff} \le 20$. This arrangement can achieve the sufficient magnetic permeability for the perpendicular external magnetic field, thereby effectively suppressing the influences of the external magnetic field in the perpendicular direction on the magnetoresistive memory MM1. The value $4\pi M_s / Hk_{eff}$ corresponds to an effective magnetic permeability $\mu$ of the magnetic shield MS1.

In this embodiment, the perpendicular magnetization generated in the magnetic shield MS1 by applying the external magnetic field in the perpendicular direction is controlled not to exceed the diamagnetic field that can be generated in the thickness direction (perpendicular direction) of the magnetic shield MS1. This arrangement can suppress the problem of loss of the shielding properties from the perpendicular external magnetic field due to the conversion of the magnetization direction of the magnetic shield MS1 into the completely perpendicular direction. The perpendicular magnetization generated in the magnetic shield MS1 can be controlled by respectively adjusting the material, structure, and formation conditions for forming the magnetic shield MS1. The diamagnetic field generated in the film thickness direction of the magnetic shield MS1 can be controlled by respectively adjusting the shape or film thickness of the magnetic shield MS1.

Figure 4:
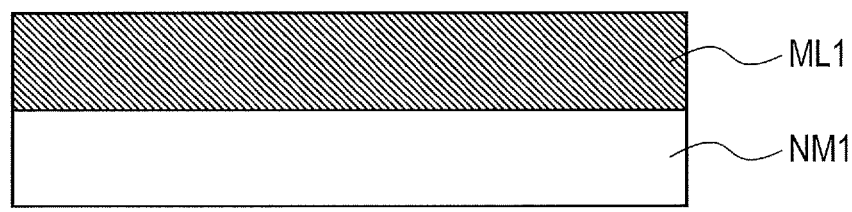
FIG. 4 is an exemplary cross-sectional view showing one example of the magnetic shield in the one embodiment.

FIG. 4 shows an exemplary cross-sectional view of one example of the magnetic shield in the one embodiment.

In the magnetic shield MS1 of this embodiment, the magnetization component in the perpendicular direction which is generated by the perpendicular external magnetic field applied to the magnetic shield MS1 can be actually generated, for example, by using an interface magnetic anisotropy.

In this embodiment, as shown in FIG. 4, for example, a magnetic layer ML1 having the in-plane magnetic anisotropy and a non-magnetic layer NM1 inducing the interface magnetic anisotropy with the magnetic layer ML1 are stacked each other to form a laminated film, which can form the magnetic shield MS1. Thus, the perpendicular magnetic anisotropy is imparted to the magnetic shield MS1 by the interface magnetic anisotropy.

The magnetic layer ML1 is formed of, for example, CoFeB, CoFe, NiFe, or NiFeCo. The non-magnetic layer NM1 is formed of, for example, an oxide film made of MgO or the like, or a non-magnetic metal film made of Ta or Pt. This arrangement can effectively induce the interface magnetic anisotropy between the magnetic layer ML1 and the non-magnetic layer NM1. In this embodiment, a combination of the magnetic layer ML1 made of CoFeB and the non-magnetic layer NM1 made of MgO can be taken as an example.

Alternatively, this embodiment can have a three-layered structure including the non-magnetic layer NM1, the magnetic layer ML1, and the non-magnetic layer NM1 which are laminated in that order, or a laminated film composed of a three-layered structure including the magnetic layer ML1, the non-magnetic layer NM1, and the magnetic layer ML1 which are laminated in that order.

Figure 5A:
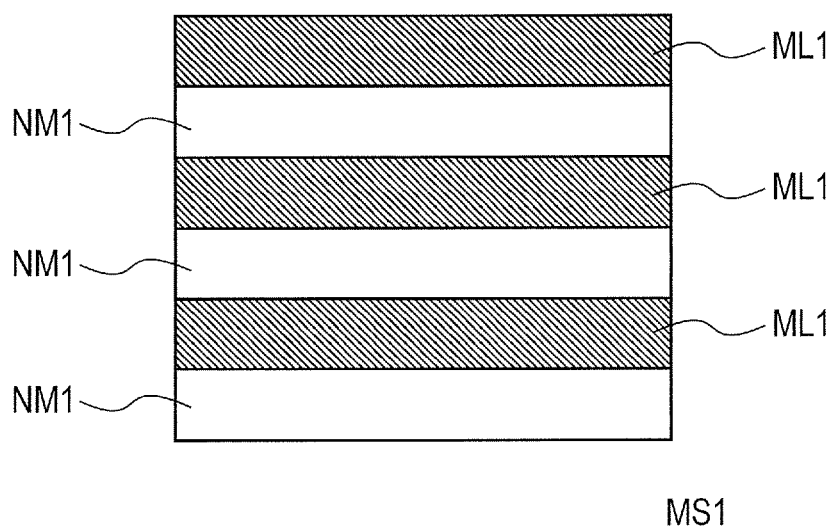
FIGS. 5A and 5B are exemplary cross-sectional views showing modified examples of the magnetic shield shown in FIG. 4.
Figure 5B:
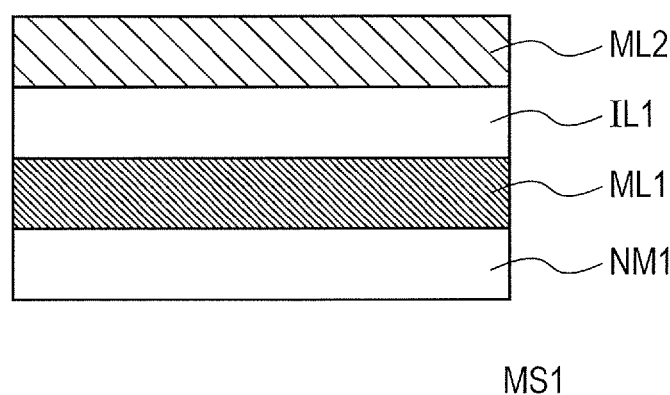

FIGS. 5A and 5B show exemplary cross-sectional views of modified examples of the magnetic shield shown in FIG. 4.

Referring to FIG. 5A, the laminated film forming the magnetic shield MS1 includes a plurality of magnetic layers ML1 and a plurality of non-magnetic layers NM1 which are alternately stacked, by way of example. In this case, at each interface between the magnetic layer ML1 and the non-magnetic layer NM1, the interface magnetic anisotropy is induced. Thus, the number of the magnetic layers ML1 and the non-magnetic layers NM1 can be adjusted to control the magnetic permeability of the magnetic shield MS1 with respect to the perpendicular external magnetic field.

FIG. 5B exemplifies the addition of a magnetic layer ML2 and an intermediate layer IL1. The magnetic layer ML2 has the in-plane magnetic anisotropy. The intermediate layer IL1 is provided between the magnetic layer ML2 and the above-mentioned laminated film of the magnetic layer ML1 and the non-magnetic layer NM1. The intermediate layer IL1 is a layer that does not induce the interface magnetic anisotropy with the magnetic layer ML2. In this case, the magnetic shield MS1 can improve its magnetic permeability for the in-plane external magnetic field. Thus, the magnetic shield MS1 can be achieved which has the excellent shielding effect from the external magnetic field in both the in-plane direction and the perpendicular direction.

The magnetic layer ML2 is formed of, for example, NiFe. Thus, the magnetic permeability of the magnetic shield MS1 from the in-plane external magnetic field can be efficiently improved. The intermediate layer IL1 is formed of, for example, Ta. Thus, the intermediate layer IL1 can prevent the interface magnetic anisotropy from being induced with the magnetic layer ML2 to stably control the magnetic permeability of the magnetic shield MS1.

In the magnetic shield MS1 of this embodiment, for example, the perpendicular magnetic anisotropy imparted to the magnetic shield MS1 can also be generated by use of a crystal magnetic anisotropy. In this case, the magnetic shield MS1 is formed of, for example, CoPt. Thus, the perpendicular magnetic anisotropy is imparted to the magnetic shield MS1 by the crystal magnetic anisotropy.

In the magnetic shield MS1 of this embodiment, for example, the perpendicular magnetic anisotropy imparted to the magnetic shield MS1 can also be generated by use of the strain magnetic anisotropy. In this case, the magnetic shield MS1 is formed of, for example, a Ni/Cu laminated film. Thus, the perpendicular magnetic anisotropy is imparted to the magnetic shield MS1 by the strain magnetic anisotropy.

The magnetoresistive memory MM1 protected by the magnetic shield MS1 includes a laminate of, for example, the magnetic reference layer RL1, a tunnel barrier layer TB1, and a magnetic recording layer MR1. The magnetic reference layer RL1 and the magnetic recording layer MR1 are a magnetic layer formed of ferromagnetic material. The tunnel barrier layer TB1 is a non-magnetic layer formed of non-magnetic material. The laminated structure of the magnetic reference layer RL1, the tunnel barrier layer TB1, and the magnetic recording layer MR1 forms a magnetic tunnel junction MTJ.

The magnetic shield MS1 is provided above or under the magnetoresistive memory MM1. As shown in FIG. 1, the flat plate-like or thin film-like magnetic shield MS1 is disposed in parallel to a plane having the lamination direction of the magnetic reference layer RL1, the tunnel barrier layer TB1, and the magnetic recording layer MR1 as a normal line. In this case, the magnetoresistive memories MM1 arranged in an array can be effectively covered. In particular, the thin film-like magnetic shield MS1 can be formed in a wiring layer forming a multilayer interconnection structure within the semiconductor chip.

In this embodiment, the magnetic recording layer MR1 and the magnetic reference layer RL1 included in the magnetoresistive memory MM1 have, for example, a perpendicular magnetic anisotropy. In this case, the magnetic recording layer MR1 and the magnetic reference layer RL1 are formed of, for example, a ferromagnetic material with a perpendicular magnetic anisotropy. The term "perpendicular magnetic anisotropy" indicates a magnetic anisotropy in which the direction perpendicular to the film surface of each layer becomes the magnetization easy axis.

The magnetic recording layer MR1 having the perpendicular magnetic anisotropy tends to be affected by the external magnetic field in the perpendicular direction. In this embodiment, however, the magnetoresistive memory MM1 can be covered by the magnetic shield MS1 with excellent shielding properties from the perpendicular external magnetic field. Thus, the magnetic shield MS1 can suppress the influence of the perpendicular external magnetic field on the magnetic recording layer MR1. Accordingly, the magnetoresistive memory MM1 including the magnetic recording layer MR1 with a perpendicular magnetic anisotropy can have the good operating performance.

The magnetic recording layer MR1 and the magnetic reference layer RL1 included in the magnetoresistive memory MM1 may have, for example, the in-plane magnetic anisotropy. In this case, the magnetic recording layer MR1 and the magnetic reference layer RL1 are formed of a ferromagnetic material having, for example, the in-plane magnetic anisotropy. The term "in-plane magnetic anisotropy" indicates a magnetic anisotropy in which the direction parallel to the film surface of each layer becomes the magnetization easy axis.

The magnetoresistive memory MM1 writes the data "1" or "0" by reversing the magnetization of the magnetic recording layer MR1. Methods for reversing the magnetization of the magnetic recording layer MR1 are not specifically limited, but can include, for example, a current magnetic field process, a spin injection process, and a domain wall displacement process. In the current magnetic field process, a magnetic field is generated by current flowing through a wiring provided around the magnetic tunnel junction MTJ, thereby reversing the magnetization of the magnetic recording layer MR1. In the spin injection process, a current is allowed to flow in such a direction as to pass through the magnetic tunnel junction MTJ, whereby the spin-polarized current is used in the magnetic reference layer RL1 to reverse the magnetization of the magnetic recording layer MR1. In the domain wall displacement process, a domain wall in the magnetic recording layer MR1 is moved by a current applied to the inside of the magnetic recording layer MR1, thereby reversing the magnetization.

A reading operation of the magnetoresistive memory MM1 is performed by allowing a current for reading to flow in such a direction as to penetrate the magnetic tunnel junction MTJ. In this way, a resistance value of the magnetic tunnel junction MTJ is detected, so that data "0" or "1" corresponding to the resistance value is read out.

When the magnetization direction of the magnetic recording layer MR1 is antiparallel to the magnetization direction of the magnetic reference layer RL1, the resistance value of the magnetic tunnel junction MTJ becomes relatively higher. In contrast, when the magnetization direction of the magnetic recording layer MR1 is the same as the magnetization direction of the magnetic reference layer RL1, the resistance value of the magnetic tunnel junction MTJ becomes relatively lower. These resistance values respectively correspond to either the data "1" or "0".

Now, the semiconductor device SD1 of this embodiment will be described.

Figure 6A:
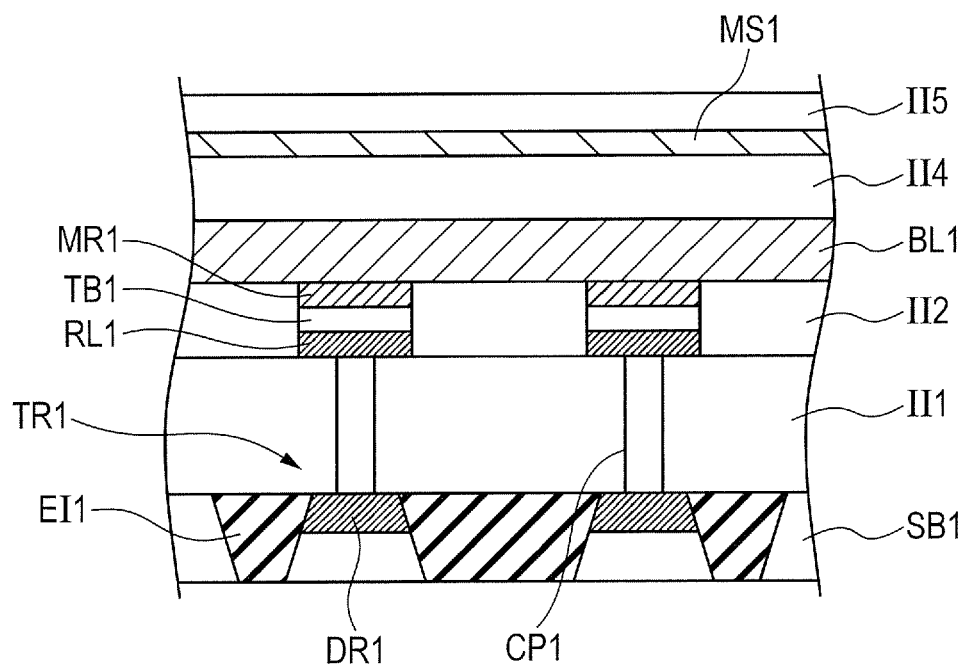
FIGS. 6A and 6B are exemplary cross-sectional views showing a semiconductor device in the one embodiment.
Figure 6B:
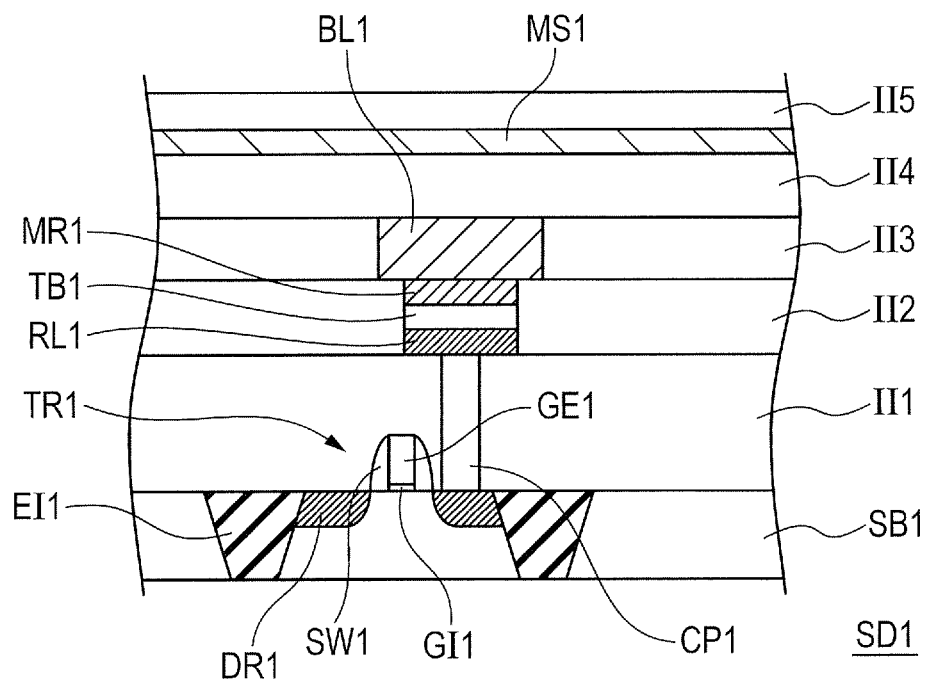

FIG. 6 is an exemplary cross-sectional view showing the semiconductor device SD1 in this embodiment. FIG. 6A shows the structure of the semiconductor device SD1 at one cross section. FIG. 6B shows the structure of the semiconductor device SD1 at another cross section perpendicular to the one cross section shown in FIG. 6A.

The semiconductor device SD1 includes the magnetoresistive memory MM1, and the magnetic shield MS1 provided above or under the magnetoresistive memory MM1. The magnetic shield MS1 and the magnetoresistive memory MM1 as described above can be used. FIG. 6 shows an example in which the magnetic shield MS1 is provided above the magnetoresistive memory MM1.

In the example shown in FIG. 6, the magnetoresistive memory MM1 and the magnetic shield MS1 can be formed within the semiconductor chip. Thus, in a post-process, a step of forming the magnetic shield MS1 can be omitted.

The semiconductor device SD1 of this embodiment includes a semiconductor substrate SB1, and a transistor TR1 provided at the semiconductor substrate SB1. The semiconductor substrate SB1 is not specifically limited, but is, for example, a silicon substrate or a compound semiconductor substrate. As shown in FIGS. 6A and 6B, the transistor TR1 includes, for example, a gate insulating film GI1 provided over a semiconductor substrate SB1, a gate electrode GE1 provided over the gate insulating film GI1, sidewalls SW1 provided over the sides of the gate electrode GE1, and source and drain regions DR1 provided at the semiconductor substrate SB1 so as to sandwich the gate electrode GE1 in the planar view. FIG. 6 shows the case where a plurality of transistors TR1 are provided at the semiconductor substrate SB1. An element isolation film EI1 is embedded in the semiconductor substrate SB1 such that the transistors TR1 are separated from each other and from other elements.

An interlayer insulating film II1 is provided over the semiconductor substrate SB1 to cover the transistor TR1. A contact plug CP1 to be coupled to the source and drain regions DR1 is embedded in the interlayer insulating film II1.

The magnetoresistive memory MM1 is provided over the interlayer insulating film II1. The magnetoresistive memory MM1 includes, for example, the magnetic reference layer RL1 provided over the interlayer insulating film II1, the tunnel barrier layer TB1 provided over the magnetic reference layer RL1, and the magnetic recording layer MR1 provided over the tunnel barrier layer TB1. At this time, the magnetic reference layer RL1 is coupled to the source and drain regions DR1, for example, via the contact plug CP1. The magnetoresistive memory MM1 is formed, for example, in the interlayer insulating film II2. The structure of the magnetoresistive memory MM1 is not limited thereto, and can be formed in an arbitrary wiring layer in the multilayer interconnection structure.

In this embodiment, the magnetic recording layer MR1 and the magnetic reference layer RL1 included in the magnetoresistive memory MM1 have, for example, a perpendicular magnetic anisotropy. On the other hand, as described later, the magnetic shield MS1 is provided above the magnetoresistive memory MM1 to cover the magnetoresistive memory MM1. The magnetic shield MS1 has good shielding properties from the perpendicular external magnetic field. Thus, the magnetic shield MS1 can reduce the influences of the perpendicular external magnetic field on the magnetic recording layer MR1. The magnetic recording layer MR1 and the magnetic reference layer RL1 included in the magnetoresistive memory MM1 may have, for example, the in-plane magnetic anisotropy.

Referring to FIG. 6, the plural magnetoresistive memories MM1 are provided by way of example. In this example, the magnetoresistive memory MM1 are provided, for example, to be coupled to the respective source and drain regions DR1 of the different transistors TR1. In the semiconductor device SD1 of this embodiment, the magnetoresistive memories MM1 arranged in an array are preferably formed.

An interlayer insulating film II3 with a bit line BL1 embedded therein is provided over the interlayer insulating film II2. The bit line BL1 is coupled, for example, to the magnetic recording layer MR1. As shown in FIG. 6, one bit line BL1 is coupled to the magnetoresistive memories MM1 by way of example. An interlayer insulating film II4 is provided over the interlayer insulating film II3.

The magnetic shield MS1 is provided over the interlayer insulating film II4. An interlayer insulating film II5 is provided over the interlayer insulating film II4 to cover the magnetic shield MS1.

The magnetic shield MS1 is disposed above the magnetoresistive memory MM1 to cover the magnetoresistive memory MM1. That is, the magnetic shield MS1 is provided above the magnetoresistive memory MM1 via an insulating layer. Thus, the magnetic shield MS1 and the magnetoresistive memory MM1 are electrically isolated from each other.

The magnetic shield MS1 has, for example, a thin-film like shape of not less than 1 nm nor more than 30 nm in thickness. As shown in FIG. 6, the magnetic shield MS1 is provided to cover the magnetoresistive memories MM1 by way of example. In this embodiment, for example, the magnetoresistive memory MM1 can be provided such that a cell array including the magnetoresistive memories MM1 arranged in an array is covered as a whole. Alternatively, the magnetic shield MS1 may be formed in a wiring layer positioned under the magnetoresistive memory MM1.

Next, the semiconductor package SP1 of this embodiment will be described.

Figure 7:
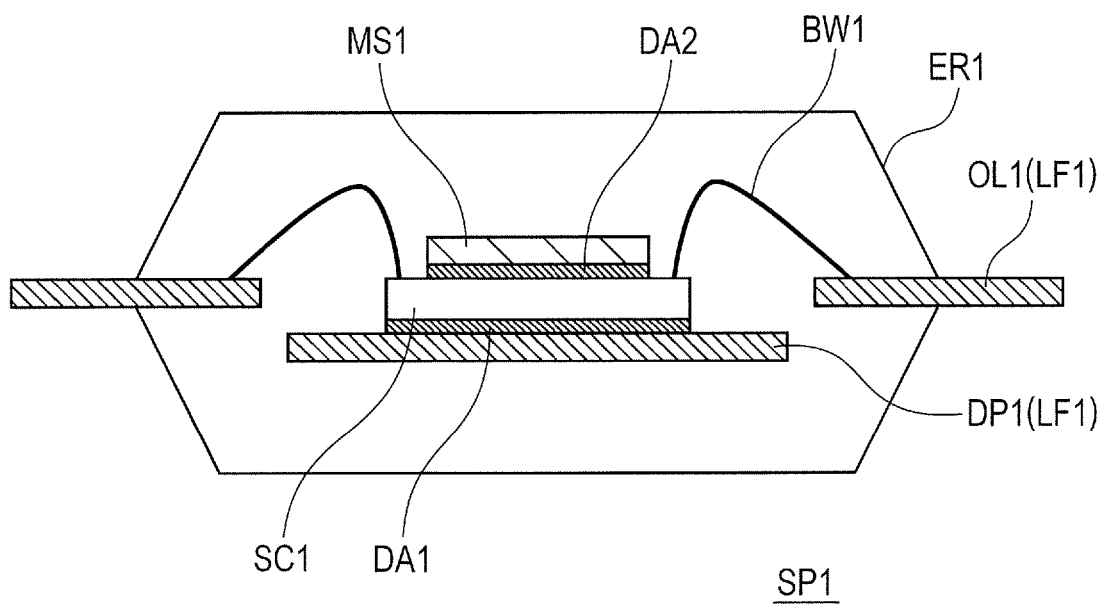
FIG. 7 is an exemplary cross-sectional view showing a semiconductor package in the one embodiment.
Figure 8:
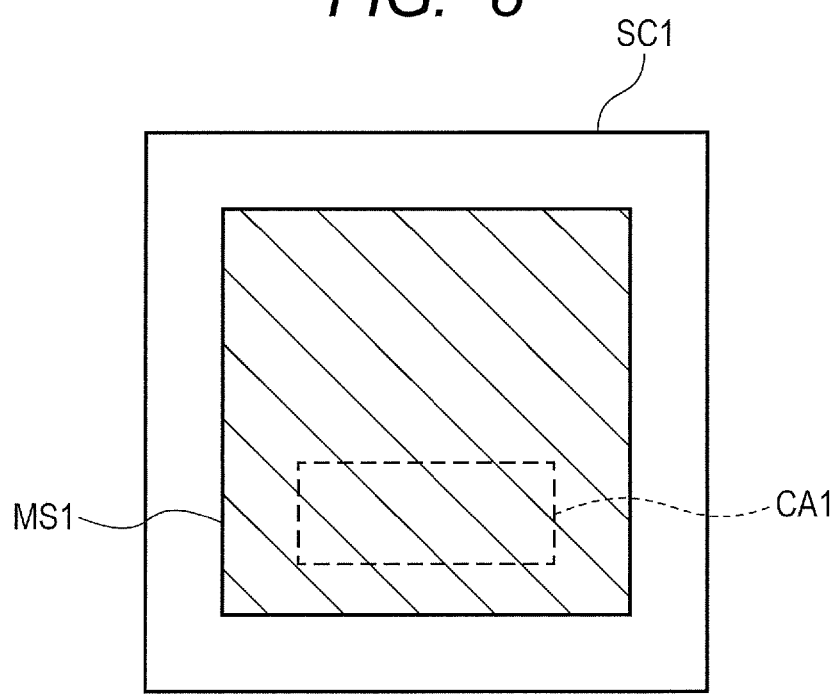
FIG. 8 is an exemplary plan view showing the positional relationship between a semiconductor chip and the magnetic shield in the semiconductor package shown in FIG. 7.

FIG. 7 shows an exemplary cross-sectional view of the semiconductor package SP1 in the one embodiment. FIG. 8 shows an exemplary plan view of the positional relationship between the semiconductor chip SC1 and the magnetic shield MS1 in the semiconductor package SP1 shown in FIG. 7. A broken line in FIG. 8 indicates a position of a region where a memory cell array CA1 is formed.

The semiconductor package SP1 includes the semiconductor chip SC1 having the magnetoresistive memory MM1, and the magnetic shield MS1 provided above or under of the semiconductor chip SC1. The magnetic shield MS1 and the magnetoresistive memory MM1 can be formed using the above-mentioned ones. FIG. 7 shows the example in which the magnetic shield MS1 is provided above the semiconductor chip SC1.

The semiconductor package SP1 of this embodiment includes, for example, a lead frame LF1. The lead frame LF1 includes a die pad DP1, and an outer lead OL1 provided around the die pad DP1.

The semiconductor chip SC1 is mounted over the die pad DP1 via a die attach layer DA1. The outer lead OL1 and an electrode pad (not shown) formed above the upper surface of the semiconductor chip SC1 are coupled together, for example, via bonding wires BW1.

The magnetic shield MS1 has, for example, a flat plate-like shape of not less than 1 μm nor more than 10 μm in thickness. Referring to FIG. 7, the magnetic shield MS1 is provided over the semiconductor chip SC1 via a die attach layer DA2 by way of example.

As shown in FIG. 8, for example, the magnetic shield MS1 provided over the semiconductor chip SC1 is smaller than that of the semiconductor chip SC1 in the planar view. That is, a visible outline of the magnetic shield MS1 in the planar view is positioned inside a visible outline of the semiconductor chip SC1 in the planar view. Thus, the electrode pad provided at the outer periphery of the semiconductor chip SC1 for coupling the bonding wire BW1 can be exposed.

A memory cell array CA1 is provided in the semiconductor chip SC1. The memory cell array CA1 is comprised of, for example, a plurality of magnetoresistive memories MM1. The magnetic shield MS1 is provided over the semiconductor chip SC1 so as to cover the entire memory array CA1 in the planar view.

In this embodiment, the magnetic recording layer MR1 and the magnetic reference layer RL1 included in the magnetoresistive memory MM1 have, for example, a perpendicular magnetic anisotropy. The magnetic shield MS1 which has the good shielding properties from the perpendicular external magnetic field is provided over the semiconductor chip SC1 to cover the magnetoresistive memory MM1. Thus, the magnetic shield MS1 can suppress the influence of the external magnetic field in the perpendicular direction for the magnetic recording layer MR1. The magnetic recording layer MR1 and the magnetic reference layer RL1 included in the magnetoresistive memory MM1 may have, for example, the in-plane magnetic anisotropy.

The semiconductor package SP1 is provided with a sealing resin ER1 for sealing therein the semiconductor chip SC1 and the magnetic shield MS1.

The structure of the semiconductor package SP1 is not limited to the above. The semiconductor package SP1 may be formed, for example, by mounting the semiconductor chip SC1 over a wiring board via a bump. Also in this case, the magnetic shield MS1 can be disposed over the semiconductor chip SC1 via the die attach layer DA2.

Figure 9:
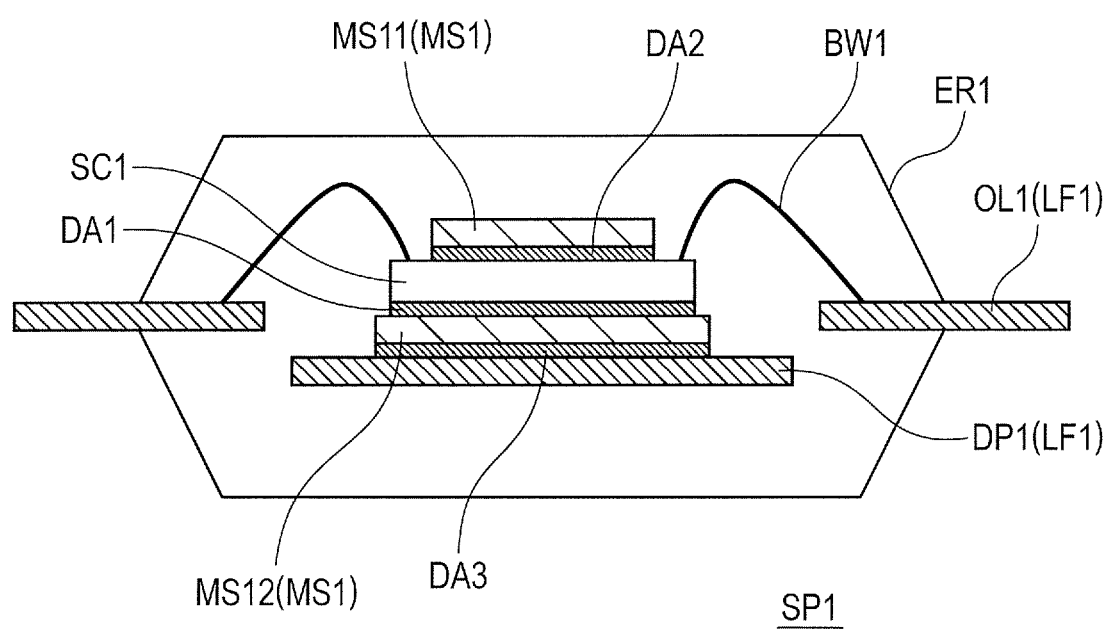
FIG. 9 is an exemplary cross-sectional view showing a modified example of the semiconductor package shown in FIG. 7.

FIG. 9 shows an exemplary cross-sectional view of a modified example of the semiconductor package SP1 shown in FIG. 7.

In the semiconductor package SP1 of the modified example, the magnetic shields MS1 are respectively provided above and under a semiconductor chip SC1. This arrangement can effectively suppress the influence of the external magnetic field on the magnetoresistive memory MM1.

As shown in FIG. 9, a magnetic shield MS12 (MS1) is provided over the die pad DP1 via a die attach layer DA3. The semiconductor chip SC1 is provided over the magnetic shield MS12 via the die attach layer DA1. A magnetic shield MS11 (MS1) is provided over the semiconductor chip SC1 via a die attach layer DA2.

In the modified example, the magnetic shield MS12 can be provided to be larger than the semiconductor chip SC1 in the planar view. At this time, a visible outline of the magnetic shield MS12 in the planar view is positioned outside a visible outline of the semiconductor chip SC1 in the planar view. This arrangement can more effectively suppress the influence on the magnetoresistive memory MM1 by the external magnetic field generated under the semiconductor chip SC1.

In contrast, the magnetic shied MS11 is provided, for example, to be smaller than the semiconductor chip SC1 in the planer view. That is, a visible outline of the magnetic shield MS11 in the planar view is positioned inside a visible outline of the semiconductor chip SC1 in the planar view. Thus, the electrode pad can be exposed to be provided at the outer periphery of the semiconductor chip SC1 and adapted to couple the bonding wires BW1.

Next, the effects of the preferred embodiments of the invention will be described.

In the embodiments of the invention, the perpendicular magnetic anisotropy is imparted to the magnetic shield having the in-plane magnetization as the remanent magnetization. In this case, the diamagnetic field acting on the magnetic shield MS1 in the film thickness direction cancels the perpendicular magnetic anisotropy imparted to the magnetic shield MS1. Thus, by applying the external magnetic field to the magnetic shield MS1 in the perpendicular direction, the magnetic shield MS1 generates a perpendicular component in the magnetization direction. That is, the magnetic shield MS1 tends to cause a change in magnetization due to the external magnetic field in the perpendicular direction, and thus can achieve the sufficient magnetic permeability of the external magnetic field in the perpendicular direction. Thus, the magnetic shield MS1 can improve its shielding properties from the external magnetic field in the perpendicular direction.

In this way, the magnetic shield of the one embodiment can improve its shielding properties from the external magnetic field.

The invention made by the inventors has been specifically described based on the embodiments. However, it is apparent that the invention is not limited to the embodiments described above, and that various modifications and changes can be made without departing from the scope of the invention.

What is claimed is:

1. A semiconductor package, comprising:

a base material;

a semiconductor chip mounted on the base material, the semiconductor chip having a magnetoresistive memory comprising: a magnetic reference layer, a tunnel barrier layer formed over the magnetic reference layer and a magnetic recording layer formed over the tunnel barrier layer, and the semiconductor chip having an upper surface and an electrode pad formed on the upper surface;

a first magnetic shield arranged on the upper surface of the semiconductor chip, the first magnetic shield having a first upper surface and a first lower surface opposite the first upper surface; and a sealing resin sealing the semiconductor chip and the first magnetic shield, wherein the first magnetic shield has magnetization in a first in-plane direction as remanent magnetization, wherein the first in-plane direction is a direction along the first upper surface of the first magnetic shield, wherein the first magnetic shield comprises a laminated film having a first magnetic layer having in-plane magnetic anisotropy and a first non-magnetic layer inducing interface magnetic anisotropy with respect to the first magnetic layer, wherein the first magnetic shield is configured to generate a perpendicular component in a magnetization direction in response to an application of a magnetic field thereto in a first perpendicular direction and to shield from the magnetic field in both the first in-plane direction and the first perpendicular direction, wherein the first perpendicular direction is a direction along a thickness direction of the first magnetic shield from one of the first upper surface and the first lower surface toward the other of the first upper surface and the first lower surface, wherein the first magnetic shield further comprises:

an intermediate layer provided directly on the laminated film having the first nonmagnetic layer and the first magnetic layer formed on the first non-magnetic layer; and a third magnetic layer formed directly on the intermediate layer, and having in-plane magnetic anisotropy, wherein the intermediate layer prevents the interface magnetic anisotropy from being induced with respect to the third magnetic layer.

2. The semiconductor package according to claim 1, wherein the base material is a lead frame, wherein the semiconductor chip is mounted on a die pad of the lead frame via a second magnetic shield, wherein the second magnetic shield has a second upper surface and a second lower surface opposite the second upper surface, wherein the second magnetic shield has magnetization in a second in-plane direction as remanent magnetization, wherein the second in-plane direction is a direction along the second upper surface of the second magnetic shield, wherein the second magnetic shield is comprised of a laminated film having a second magnetic layer having in-plane magnetic anisotropy and a second non-magnetic layer inducing interface magnetic anisotropy with respect to the second magnetic layer, wherein the second magnetic shield is configured to generate a perpendicular component in a magnetization direction in response to an application of a magnetic field thereto in a second perpendicular direction, and wherein the second perpendicular direction is a direction along a thickness direction of the second magnetic shield from one of the second upper surface and the second lower surface to the other of the second upper surface and the second lower surface.

3. The semiconductor package according to claim 1, wherein $4\pi Ms$ is a perpendicular saturated magnetization generated by an external magnetic field Hkeff in the first perpendicular direction, and a following formula is satisfied: $5 \leq 4\pi Ms/Hkeff \leq 20$.

4. The semiconductor package according to claim 1, wherein the first magnetic layer is formed of CoFeB, CoFe, NiFe, or NiFeCo, and wherein the first non-magnetic layer is formed of MgO, Ta, or Pt.

5. The semiconductor package according to claim 1, wherein the laminated film includes a plurality of the first magnetic layers and a plurality of the first non-magnetic layers which are alternately stacked on each other.

6. The magnetic shield according to claim 1, wherein the third magnetic layer is formed of NiFe, and the intermediate layer is formed of Ta.

7. The magnetic shield according to claim 1, wherein the first magnetic shield is formed directly on an upper surface of the electrode pad.

* * * * *